(12) United States Patent
Takasaki et al.

(10) Patent No.: US 6,733,901 B2
(45) Date of Patent: May 11, 2004

(54) PROCESS FOR PRODUCTION OF EPOXY RESIN COMPOSITION FOR SEMICONDUCTOR ENCAPSULATION, EPOXY RESIN COMPOSITION FOR SEMICONDUCTOR ENCAPSULATION, AND SEMICONDUCTOR DEVICE

(75) Inventors: Noriyuki Takasaki, Tokyo (JP); Kenji Takayama, Tokyo (JP); Kazuo Noda, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 10/136,484

(22) Filed: May 2, 2002

(65) Prior Publication Data

US 2003/0027899 A1 Feb. 6, 2003

(30) Foreign Application Priority Data

May 2, 2001 (JP) ........................................ 2001-134773

(51) Int. Cl.$^7$ .............................................. H01L 29/12
(52) U.S. Cl. ........................ 428/620; 257/787; 257/793; 257/795; 428/413; 523/443; 523/466
(58) Field of Search ................................ 523/443, 466; 257/787, 793, 795; 428/413, 620

(56) References Cited

U.S. PATENT DOCUMENTS 6,495,260 B1 * 12/2002 Takasaki ..................... 428/413

FOREIGN PATENT DOCUMENTS

| JP | 56-149454 A | 11/1981 |
| JP | 3-195764 A | 8/1991 |
| JP | 4-59863 A | 2/1992 |
| JP | 9-52228 A | 2/1997 |
| WO | 00/77851 | * 12/2000 |

* cited by examiner

Primary Examiner—Robert Dawson
Assistant Examiner—D. Aylward
(74) Attorney, Agent, or Firm—Smith, Gambrell & Russell, LLP

(57) ABSTRACT

The present invention provides a process for producing an epoxy resin composition for semiconductor encapsulation which, when used in encapsulation of a semiconductor chip, can minimize voids appearing in the semiconductor device obtained. That is, the present invention provides a process for producing an epoxy resin composition for semiconductor encapsulation, which comprises premixing raw materials containing at least an epoxy resin, a phenolic resin, a curing accelerator and an inorganic filler, then grinding the resulting premix using a grinder to obtain a ground material having such a particle size distribution that particles having particle diameters of 250 $\mu$m or more are 10% by weight or less, particles having particle diameters of 150 $\mu$m to less than 250 $\mu$m are 15% by weight or less and particles having particle diameters of less than 150 $\mu$m are 75% by weight or more, and melt-kneading the ground material under a reduced pressure, or melt-kneading the ground material and then exposing the resulting molten material to a reduced pressure.

17 Claims, No Drawings

US 6,733,901 B2

PROCESS FOR PRODUCTION OF EPOXY RESIN COMPOSITION FOR SEMICONDUCTOR ENCAPSULATION, EPOXY RESIN COMPOSITION FOR SEMICONDUCTOR ENCAPSULATION, AND SEMICONDUCTOR DEVICE

TECHNICAL FIELD

The present invention relates to a process for producing an epoxy resin composition for semiconductor encapsulation which, when used in encapsulation of a semiconductor chip, can minimize voids appearing in the semiconductor device obtained; an epoxy resin composition produced by using the above process; and a semiconductor device produced by using the above epoxy resin composition.

BACKGROUND ART

Epoxy resin compositions, which can be subjected to transfer molding, are in wide use for encapsulation of semiconductor chips such as IC, LSI and the like, from the viewpoints of their reliability and productivity.

Epoxy resin compositions are composed of an epoxy resin, a phenolic resin, a curing accelerator, an inorganic filler, a releasing agent, a flame retardant, a coupling agent, etc. The compositions are ordinarily produced by weighing required amounts of raw materials, premixing them by using a mixer such as Henschel mixer or the like, then melt-kneading the resulting premix by using a heated kneader such as monoaxial kneader, biaxial kneader, heated roll, continuous kneader or the like, to mix and disperse the individual raw materials uniformly.

As electronic appliances have become smaller, lighter and more functional, the semiconductor packages used therein have become increasingly smaller, thinner and narrower in pitch. In such a situation, epoxy resin compositions used for semiconductor encapsulation are strongly required to have higher soldering heat resistance and higher moisture resistance, because the heat resistance and moisture resistance have an influence on the reliability of the semiconductor packages obtained by encapsulation using the epoxy resin compositions.

Therefore, epoxy resin compositions have come to contain an increased amount of an inorganic filler so that the semiconductor packages obtained therewith can have lower internal stress and lower hygroscopicity. This increase in the amount of the inorganic filler used, however, has reduced fluidity during encapsulation and has increased defects in molding, such as lead frame deformation, gold wire deformation, voids generation and the like.

Against the above problems, it is being tried to keep fluidity of an epoxy resin composition and improve the filling characteristic thereof by optimizing the particle shape and particle diameter distribution of the inorganic filler used or by minimizing the viscosities of the used epoxy resin, phenolic resin, etc. at encapsulation temperature. However, the task of decreasing voids is difficult to achieve and is drawing increasing attention.

The voids of an epoxy resin composition is considered to be reducible by increasing the degree of kneading of the composition in the melt-kneading step to improve the wettability between the resin components and the inorganic filler and the dispersibility of the inorganic filler. However, in some cases the increase in the kneading degree in the melt-kneading step alone causes a curing reaction of the composition by the thermal history added in the step and consequently impairs the fluidity of the composition.

Hence, there have been used, for example, processes which comprise combining only those raw materials which cause no curing reaction at the premixing step, among all materials, and melt-mixing the combined raw materials at a temperature higher than the temperature at which they melt or soften, and then conducting melt-kneading for all the raw materials (e.g. JP-A-56-149454, JP-A-4-59863 and JP-A-3-195764).

There have also been proposed, for example, processes which comprise selecting an optimum heated kneader and employing optimum kneading conditions to minimize the curing reaction occurring in the heated kneader and improve the wettability between the resin components and the inorganic filler and the dispersibility of the inorganic filer (e.g. JP-A-9-52228).

However, in conducting melt-mixing at a high temperature in the premixing step, the raw materials usable therein have been restricted. Further, only with the selection of an optimum kneader and the use of optimum kneading conditions, it has been difficult to reduce the generation of voids stably.

For solution thereof, it is considered to make finer and more homogeneous the premix of raw materials prior to their melt-mixing, to reduce the generation of voids.

However, it has been found that only with making finer and more homogeneous the premix of raw materials prior to their melt-mixing, remarkable reduction in voids generation is difficult and further improvement is necessary, in a resin composition wherein a low-viscosity resin, particularly a crystalline epoxy resin and a low-viscosity phenolic curing agent are used and thereby the content of an inorganic filler is increased in order to further increase the soldering heat resistance of the composition.

DISCLOSURE OF THE INVENTION

The present invention relates to a process for producing an epoxy resin composition for semiconductor encapsulation which, when used in encapsulation of a semiconductor chip, can minimize voids appearing in the semiconductor device obtained. The present invention also provides an epoxy resin composition for semiconductor encapsulation, very low in voids generation, and a semiconductor device produced by encapsulation with the composition.

The present inventors made a study in view of the above-mentioned situation. As a result, the present inventors found out newly that the voids generation in an encapsulated material produced with an epoxy resin composition can be remarkably reduced by making finer and more homogeneous a premix of raw materials prior to their melt-kneading, then melt-kneading the resulting material under a reduced pressure using a kneader, or melt-kneading the material using a kneader, followed by, for example, passing the resulting molten material through an apparatus of reduced pressure. The present invention has been completed based on the above finding.

The present invention lies in a process for producing an epoxy resin composition for semiconductor encapsulation, which comprises premixing raw materials containing at least an epoxy resin, a phenolic resin, a curing accelerator and an inorganic filler, then grinding the resulting premix using a grinder to obtain a ground material having such a particle size distribution that particles having particle diameters of 250 $\mu$m or more are 10% by weight or less, particles having particle diameters of 150 $\mu$m to less than 250 $\mu$m are 15% by weight or less and particles having particle diameters of less than 150 μm are 75% by weight or more, and melt-kneading the ground material under a reduced pressure.

The present invention lies also in a process for producing an epoxy resin composition for semiconductor encapsulation, which comprises premixing raw materials containing at least an epoxy resin, a phenolic resin, a curing accelerator and an inorganic filler, then grinding the resulting premix using a grinder to obtain a ground material having such a particle size distribution that particles having particle diameters of 250 μm or more are 10% by weight or less, particles having particle diameters of 150 μm to less than 250 μm are 15% by weight or less and particles having particle diameters of less than 150 μm are 75% by weight or more, melt-kneading the ground material, and exposing the resulting molten material to a reduced pressure.

In a preferred embodiment of the above processes, the reduced pressure is 460 mmHg or less when normal pressure is 760 mmHg and the melt-kneading is conducted using a biaxial kneader or a monoaxial kneader.

The present invention lies further in an epoxy resin composition for semiconductor encapsulation, produced by using the above process for producing an epoxy resin composition for semiconductor encapsulation, as well as in a semiconductor device produced by using the epoxy resin composition for semiconductor encapsulation.

DETAILED DESCRIPTION OF THE INVENTION

As to the epoxy resin used in the present invention, there is no particular restriction as long as it has at least two epoxy groups in the molecule and is a solid at normal temperature. There are mentioned, for example, bisphenol type epoxy resin, biphenyl type epoxy resin, phenol novolac type epoxy resin, cresol novolac type epoxy resin, and alkyl-modified triphenolmethane type epoxy resin. These resins may be used singly or in admixture.

When a crystalline epoxy resin such as biphenyl type epoxy resin or the like is used, the resin preferably has a melting point of 50 to 150° C. When the melting point is less than 50° C., a rise in resin temperature takes place in the premixing of raw materials, owing to the generation of a frictional heat, and melting begins; as a result, the workability of premixing is reduced and a slight reduction in productivity may appear.

Meanwhile, when the melting point is more than 150° C., a very high temperature is needed in order to melt the epoxy resin in the step of melt-kneading; as a result, it is difficult to prevent the proceeding of a curing reaction and it may be impossible to allow the final resin composition to have appropriate fluidity during encapsulation.

The melting point can be known easily according to an ordinary method of judging the melting temperature of a resin in a glass capillary, from the appearance of the resin, or a method of using a differential scanning calorimeter.

The amount of the epoxy resin used is preferably 2.5 to 17% by weight in the total composition.

As to the phenolic resin used in the present invention, there is no particular restriction as long as it is a solid at normal temperature. There are mentioned, for example, phenol novolac resin, cresol novolac resin, dicyclopentadiene-modified phenolic resin, phenol aralkyl resin, naphthol aralkyl resin and terpene-modified phenolic resin. These resins may be used singly or in admixture. The amount of the phenolic resin used is preferably 2 to 13% by weight in the total composition.

As the inorganic filler used in the present invention, there are mentioned fused silica powder, crystalline silica powder, alumina, silicon nitride, etc. These fillers may be used singly or in admixture.

The inorganic filler may be an inorganic filler which has been surface-treated with a coupling agent. The surface-treated inorganic filler may be used singly or in admixture of two or more kinds. It is possible to use a mixture of a surface-treated inorganic filler and a surface-non-treated inorganic filler. The amount of the inorganic filler is preferably 74 to 94% by weight in the total composition from the viewpoint of the balance of moldability and reliability.

The curing accelerator used in the present invention can be any compound capable of accelerating the curing reaction between epoxy group and phenolic hydroxyl group. Curing accelerators ordinarily used in resins for semiconductor encapsulation can be used.

There can be mentioned, for example, 1,8-diazabicyclo (5,4,0)undecene-7, triphenylphosphine and 2-methylimidazole. They can be used singly or in admixture. The amount of the curing accelerator used is preferably 0.1 to 1% by weight in the total composition.

A coupling agent can be used in the present invention. As to the coupling agent, there is no particular restriction. However, there are preferred, for example, silane coupling agents such as γ-glycidoxypropyltri-methoxysilane, γ-aminopropyltrimethoxysilane, γ-mercaptopropyltrimethoxysilane, vinyltriethoxysilane and the like. As the coupling agent used for surface-treating the inorganic filler, amino type silane coupling agents are preferred. These coupling agents may be used singly or in admixture. Even when an inorganic filler surface-treated with a coupling agent is used, it is possible to further add a coupling agent at the time of premixing.

A flame retardant can be used in the present invention. The flame retardant can be exemplified by antimony oxides such as antimony trioxide, antimony pentoxide and the like; bromine compounds such as brominated epoxy resin and the like; metal compounds such as aluminum hydroxide, magnesium hydroxide, zinc borate and the like; phosphorus compounds such as phosphoric acid ester, red phosphorus and the like; and nitrogen compounds such as melamine and the like. However, the flame retardant is not restricted thereto.

A releasing agent can be used in the present invention. The releasing agent can be exemplified by higher fatty acid esters such as carnauba wax, montanic acid ester and the like; higher fatty acids such as stearic acid, montanic acid and the like; metal salts of higher fatty acids, such as zinc stearate, calcium montanate and the like; higher fatty acid amides such as N-stearylstearamide, ethylenebisstearamide, m-xylylenebisstearamide and the like; and polyolefin compounds such as polyethylene, oxidized polyethylene and the like. However, the releasing agent is not restricted thereto.

An ion-trapping agent can be used in the present invention. The ion-trapping agent is a compound added in order to trap, for example, a cation such as sodium ion, potassium ion or the like or an anion such as chlorine ion, bromine ion or the like and prevent corrosion of a chip, and can be exemplified by hydrotalcites, bismuth oxides and antimony pentoxide. However, the ion-trapping agent is not restricted thereto.

A coloring agent can be used in the present invention. The coloring agent can be exemplified by organic dyes and organic pigments such as carbon black, azo compound and phthalocyanine compound.

A low-stress compound can be used in the present invention. The low-stress agent is a low-elasticity substance added in order to reduce the stress appearing in molding of epoxy resin composition or the stress appearing in heating or cooling of cured material, and can be exemplified by organic rubbers (e.g. polybutadiene and acrylonitrile-butadiene copolymer rubber) and silicone rubbers (e.g. polydimethylsiloxane). However, the low-stress agent is not restricted thereto.

The main components used in the epoxy resin composition of the present invention, such as epoxy resin, phenolic resin, inorganic filler and the like are each weighed by a given amount and then premixed using a Henschel mixer or the like. The resulting premix is ground using a grinder to make finer the individual components and achieve their homogeneous dispersion. Other components such as flame retardant, releasing agent, ion-trapping agent, coloring agent, low-stress agent and the like are used ordinarily each in a small amount of 5% by weight or less in the epoxy resin composition; despite such a small amount, each of these components is made finer and dispersed homogeneously in the epoxy resin composition, by the grinding with a grinder, conducted after the premixing.

The ground material obtained by grinding with a grinder needs to have such a particle size distribution that particles having particle diameters of 250 $\mu$m or more are 10% by weight or less, particles having particle diameters of 150 $\mu$m to less than 250 $\mu$m are 15% by weight or less and particles having particle diameters of less than 150 $\mu$m are 75% by weight or more. The ground material preferably contains, in the acetone insoluble, particles having particle diameters of 212 $\mu$m or more, in an amount of 0.5% by weight or less.

When, in the particle size distribution, the particles having particle diameters of 250 $\mu$m or more are more than 10% by weight, the particles having particle diameters of 150 $\mu$m to less than 250 $\mu$m are more than 15% by weight and the particles having particle diameters of less than 150 $\mu$m are less than 75% by weight, the ground material does not become a uniform dispersion in the step of melt-kneading and, when the resulting composition is used for encapsulation of a semiconductor chip, the semiconductor device obtained has voids and accordingly defects. When the ground material contains, in the acetone insoluble, particles having particle diameters of 212 $\mu$m or more, in an amount of more than 0.5% by weight and the resulting composition is used for encapsulation of a chip, the semiconductor device obtained may have voids.

The particle size distribution of the ground material is determined by using two kinds of sieves each having an opening of 250 $\mu$m or 150 $\mu$m, a sample amount of 6 g each time, and a powder tester produced by Hosokawa Micron K. K. (amplitude: 1 mm, frequency: 3,000 vpm, 60 seconds).

The acetone insoluble of the ground material is determined as follows. 200 cc of acetone (purity: 99.5% or more) and 100 g of a ground material are placed in a container; the container is shaken at normal temperature using a shaker produced by Yamato K.K. (frequency: 3 Hz, shaking time: 20 minutes) to disperse the ground material in acetone; the resulting suspension is passed through a sieve having an opening of 212 $\mu$m; the insoluble remaining on the sieve is dried and then weighed and the percentage of the resulting weight to the weight of the ground material is taken as the acetone insoluble of the ground material.

As to the grinder, there is no particular restriction as long as an intended particle size distribution can be obtained therewith. However, there are preferred vibration ball mill, closed multi-stage shear extruder, continuous type rotary ball mill, batch type rotary ball mill, corundum mill, jet mill, roller mill, etc. They may be used in combination. A grinder having a cooling mechanism is preferred in order to prevent the melting or softening of resin components during grinding.

The ground material is then melt-kneaded. As the kneader used in the melt-kneading, there can be used, for example, ordinary kneaders such as biaxial kneader, monoaxial kneader (including co-kneader) and the like. A kneader with a heating mechanism is preferred, and a biaxial kneader or a monoaxial kneader is more preferred.

The melt-kneading using such a kneader is conducted under a reduced pressure. It is also possible to conduct melt-kneading and then expose the resulting molten material to a reduced pressure. There is no particular restriction as to the method for applying a reduced pressure. However, it is preferred to apply a reduced pressure in a state that the melt-kneaded resin composition stays molten. It is also preferred to use such a structure that the molten resin composition is not sucked into a vacuum pump system.

When the molten composition after melt-kneading is exposed to a reduced pressure, it can be conducted, for example, by providing, at the front of a kneader, a facility in which a box (called a cascade) and an extruder are integrated, and discharging air from the cascade using a vacuum pump, to make vacuum the inside of the facility to continuously produce an intended composition. It is also possible to conduct kneading and cooling using a kneader, then heating and melting the kneaded material, and exposing the molten material to a reduced pressure.

The present inventors found out that the voids appearing in molding of a resin composition can be greatly reduced by conducting melt-kneading by a kneader under a reduced pressure, or by exposing the molten resin composition obtained from melt-kneading by a kneader, to a reduced pressure. The first reason therefor is considered to be that the reduced pressure can effectively remove the water and organic volatile component in the resin composition and therefore the generation of volatile components in molding (this leads to generation of voids) is minimized. The second reason is considered to be that the reduced pressure can prevent the trapping of air in kneading of a large amount of fused silica and a resin component of low melt viscosity or can remove the bubbles of trapped air. The trapped air is considered to include not only the air trapped by mere physical stirring but also the air bubbles generated by the volume change taking place when an epoxy resin melts and suddenly becomes a liquid. It is considered that removal of air bubbles becomes easier by making the resin composition components finer and more homogeneous prior to kneading.

The reduced pressure used in melt-kneading is 460 mmHg or less, preferably 310 mmHg or less when normal pressure is 760 mmHg. When the reduced pressure is higher than 460 mmHg, voids reduction during molding is low and it may not be possible to obtain a sufficient effect.

In the process for producing an epoxy resin composition for semiconductor encapsulation according to the present invention, steps other than those mentioned above can be carried out by known procedures. The semiconductor device of the present invention can be produced by a known process.

BEST MODE FOR CARRYING OUT THE INVENTION

The present invention is described specifically below by showing Examples. However, the present invention is in no way restricted by the following Examples.

| Basic formulation | |
|---|---|
| Biphenyl type epoxy resin (YX4000H, a product of Yuka Shell Epoxy Kabushiki Kaisha, melting point: 105° C., epoxy equivalent: 195) | 4.5 parts by weight |
| Phenol aralkyl resin (XLC-4L, a product of Mitsui Chemicals, Inc., melt viscosity at 150° C.: 1.1 poise, hydroxyl equivalent: 170) | 4.5 parts by weight |
| Brominated phenol novolac type epoxy resin (softening point: 85° C., epoxy equivalent: 280) | 1.0 part by weight |
| 1,8-Diazabicyclo (5, 4, 0)undecene-7 | 0.2 part by weight |
| Fused silica | 86.0 parts by weight |
| Antimony trioxide | 1.0 part by weight |
| Carnauba wax | 0.5 part by weight |
| Carbon black | 0.3 part by weight |

Evaluation Methods

1. Evaluation Methods for Ground Material

Acetone insoluble 200 cc of acetone (purity: 99.5% or more) and 100 g of a ground material were placed in a container; the container was shaken at normal temperature using a shaker produced by Yamato K.K. (frequency: 3 Hz, shaking time: 20 minutes) to disperse the ground material in acetone; the resulting suspension was passed through a sieve having an opening of 212 μm; the insoluble remaining on the sieve was dried and then weighed and the percentage of the resulting weight to the weight of the ground material was taken as the acetone insoluble of the ground material.

Particle Size Distribution

Particle size was determined by using a tester (a powder tester produced by Hosokawa Micron K.K., amplitude: 1 mm, frequency: 3,000 vpm, time: 60 seconds, openings of two kinds of sieves used: 250 μm and 150 μm, sample amount: 6 g each time).

Dispersion Degree of Composition Components

A sample (obtained by subjecting a ground material to compression molding at 100 kg/cm² at room temperature for 60 seconds, curing the compression-molded material at 100° C. for 48 hours, embedding the cured material with an epoxy resin, then subjecting the resulting material to polishing and scratch polishing, and vapor-depositing carbon on the polished material) was determined for standard deviation of silica strength distribution using an analyzer (Electron Probe Microanalyzer, a product of Japan Electron Optical Laboratory Co., Ltd.); and the standard deviation was taken as an index of the dispersion degree of the composition components of the sample. A larger value of dispersion degree refers to more ununiform dispersion.

2. Evaluation Methods for Epoxy Resin Composition

Number of Voids

A semiconductor package of 160p QFP (body size: 28 mm×28 mm, package thickness: 3.6 mm, IC chip size: 15 mm×15 mm) was formed by encapsulation; the number of voids (having major diameters of 0.1 mm or more) present in the semiconductor package was examined by an ultrasonic flaw detector; and the number of voids per package was counted. The transfer molding conditions used for forming the semiconductor package were die temperature =175° C.; injection pressure =100 kg/cm²; injection time =15 seconds; pressure-holding time=120 seconds; and material preheating temperature =80° C.

Fluidity

An epoxy resin composition for semiconductor encapsulation was measured for spiral flow using a transfer molding machine fitted with a die for spiral flow measurement based on EMMI-I-66. The transfer molding conditions were die temperature =175° C.; injection pressure =70 kg/cm²; and pressure-holding and curing time =120 seconds.

Dispersion Degree of Composition Components

A sample (obtained by subjecting an epoxy resin composition for semiconductor encapsulation after melt-kneading to compression molding at 170° C. at 30 kg/cm² for 120 seconds, embedding the compression-molded material with an epoxy resin, then subjecting the resulting material to polishing and scratch polishing, and vapor-depositing carbon on the polished material) was determined for standard deviation of silica strength distribution using an analyzer (Electron Probe Microanalyzer, a product of Japan Electron Optical Laboratory Co., Ltd.); and the standard deviation was taken as an index of the dispersion degree of the composition components of the sample.

Volatile Content

An epoxy resin composition powder after grinding was weighed by 5 g to an accuracy of 0.1 mg in an aluminum cup. Then, a heat treatment was conducted for 3 hours in an thermostat of 105 ±2° C. The composition after heat treatment was allowed to cool in a desiccator for 30 minutes, after which it was weighed to an accuracy of 0.1 mg. Volatile content was determined using the following formula.

Volatile content (%)={[initial weight (g)−weight after heat treatment (g)]×100}/initial weight (g)

Granule Density

A given amount of distilled water and few drops of a surfactant were filled in a 50-cc pycnometer, and the pycnometer was weighed. Into the pycnometer was placed a sample which had been obtained by passing an epoxy resin composition powder through a sieve having an opening of 500 μm and then weighing 5 g of the material remaining on the sieve, to an accuracy of 0.1 mg. Then, the total weight of the pycnometer was weighed. Granule density was determined using the following calculation formula.

Granule density $(g/cc)=(Mp \times pw)/(Mw+Mp-Mt)$

Pw: density (g/cc) of distilled water at the measurement temperature

Mw: weight (g) of pycnometer filled with distilled water

Mp: weight (g) of sample

Mt: weight (g) of pycnometer filled with distilled water, surfactant and sample

EXAMPLE 1

Raw materials weighed so as to satisfy the basic formulation were premixed for 20 minutes using a Henschel mixer (capacity: 200 liters, number of rotations: 500 rpm) maintained at room temperature. The resulting premix was finely ground using a closed multi-stage shear extruder (a continuous kneader and extruder, KCK80X2V, a product of KCK K.K., rotary blade diameter: 80 mm, four blades, number of blade rotations: 300 rpm, discharge amount: 20 kg/hr) with the material temperature being kept at 30° C. or less. The resulting ground material was melt-kneaded using an intermeshing co-rotating twin screw kneader (screw diameter D: 50 mm, kneader shaft length: 600 mm, length of melt-kneading section: 6D, number of screw rotations: 100 rpm, discharge amount: 15 kg/hr) with the kneader inside being kept at a reduced pressure of 60 mmHg (when normal pressure was 760 mmHg) by a vacuum pump. The discharged material was passed through a thickness-controlling roll (sheeting roll) to obtain a sheet of 2 mm in thickness. The sheet was cooled and ground to obtain an epoxy resin composition.

In Table 1 are shown the evaluation results for the ground material obtained by premixing and grinding and the epoxy resin composition obtained by melt-kneading the ground material at a reduced pressure.

EXAMPLE 2

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was finely ground using a continuous type rotary ball mill (Dynamic Mill MYD 25, a product of Mitsui Mining Co., Ltd., number of screw rotations: 500 rpm, ball diameter: 10 mm, discharge amount: 200 kg/hr) with the material temperature being kept at 30° C. or less. The resulting ground material was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated, with the facility inside being exposed to a reduced pressure (60 mmHg when normal pressure was 760 mmHg) by discharging air from the cascade using a vacuum pump. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

EXAMPLE 3

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was finely ground for 20 minutes using a batch type rotary ball mill (Ball Mill 200, a product of Chuo Kakoki Shoji, number of rotations: 30 rpm, ball diameter: 25 mm, treating capacity: 30 kg/batch) with the material temperature being kept at 30° C. or less. The resulting ground material was melt-kneaded using an intermeshing co-rotating twin screw kneader (screw diameter D: 50 mm, kneader shaft length: 600 mm, length of melt-kneading section: 6D, number of screw rotations: 100 rpm, discharge amount: 15 kg/hr) with the kneader inside being kept at a reduced pressure of 60 mmHg (when normal pressure was 760 mmHg) by a vacuum pump. The discharged material from the kneader was passed through a thickness-controlling roll (sheeting roll) to obtain a sheet of 2 mm in thickness. The sheet was cooled and ground to obtain an epoxy resin composition.

In Table 1 are shown the evaluation results.

EXAMPLE 4

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was finely ground using a roller mill (HH 178, a product of Inoue Seisakusho, three rolls, number of front roll rotations: 80 rpm, discharge amount: 50 kg/hr) with the material temperature being kept at 30° C. or less. The resulting ground material was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated, with the facility inside being exposed to a reduced pressure (60 mmHg when normal pressure was 760 mmHg) by discharging air from the cascade using a vacuum pump. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

EXAMPLE 5

Raw materials weighed so as to satisfy the basic formulation were premixed for 20 minutes using a Henschel mixer {capacity: 200 liters, number of rotations: 500 rpm} maintained at room temperature in the same manner as in Example 1. The resulting premix was finely ground using a roller mill (HH 178, a product of Inoue Seisakusho, three rolls, number of front roll rotations: 80 rpm, discharge amount: 50 kg/hr) with the material temperature being kept at 30° C. or less. The resulting ground material was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated, with the facility inside being exposed to a reduced pressure (410 mmHg when normal pressure was 760 mmHg) by discharging air from the cascade using a vacuum pump. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 1

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 2

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was finely ground using a corundum mill (T-2A, a product of Taiheiyo Kiko, number of rotations: 100 rpm, discharge amount: 100 kg/hr) with the material temperature being kept at 30° C. or less. The resulting ground material was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 3

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was melt-kneaded using an intermeshing co-rotating twin screw kneader (screw diameter D: 50 mm, kneader shaft length: 600 mm, length of melt-kneading section: 6D, number of screw rotations: 100 rpm, discharge amount: 15 kg/hr) without exposing the kneader inside to a reduced pressure. The discharged material from the kneader was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 4

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was finely ground using a vibration ball mill (YAMT-20, a product of Yasukawa Shoji, frequency: 16 Hz, treating capacity: 50 kg/hr) with the material temperature being kept at 30° C. or less. The resulting ground material was melt-kneaded using an intermeshing co-rotating twin screw kneader (screw diameter D: 50 mm, kneader shaft length: 600 mm, length of melt-kneading section: 6D, number of screw rotations: 100 rpm, discharge amount: 15 kg/hr) without exposing the kneader inside to a reduced pressure. The discharged material from the kneader was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 5

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was melt-kneaded using an intermeshing co-rotating twin screw kneader (screw diameter D: 50 mm, kneader shaft length: 600 mm, length of melt-kneading section: 6D, number of screw rotations: 100 rpm, discharge amount: 15 kg/hr) with the kneader inside being kept at a reduced pressure of 60 mmHg (when normal pressure was 760 mmHg) by a vacuum pump. Then, the molten resin composition from the biaxial kneader was passed through a thickness-controlling roll (sheeting roll) to obtain a sheet of 2 mm in thickness. The sheet was cooled and ground to obtain an epoxy resin composition.

In Table 1 are shown the evaluation results.

Comparative Example 6

Raw materials weighed so as to satisfy the basic formulation were premixed for 20 minutes using a Henschel mixer (capacity: 200 liters, number of rotations: 500 rpm) maintained at room temperature in the same manner as in Example 1. The resulting premix was melt-kneaded using a monoaxial kneader (screw diameter D: 46 mm, kneader shaft length: 500 mm, length of melt-kneading section: 7D, number of screw rotations: 200 rpm, discharge amount: 30 kg/hr). Then, the molten resin composition from the monoaxial kneader was passed through a facility (connected to the front end of the kneader) in which a box (called a cascade) and an extruder were integrated, with the facility inside being exposed to a reduced pressure (60 mmHg when normal pressure was 760 mmHg) by discharging air from the cascade using a vacuum pump. The discharged material from the extruder of the facility was passed through a thickness-controlling roll (sheeting roll) to obtain a sheet of 2 mm in thickness. The sheet was cooled and ground to obtain an epoxy resin composition.

In Table 1 are shown the evaluation results.

TABLE 1

| | | Examples | | | | | Comparative Examples | | | | | |
|---|---|---|---|---|---|---|---|---|---|---|---|---|
| | | 1 | 2 | 3 | 4 | 5 | 1 | 2 | 3 | 4 | 5 | 6 |
| Grinder used after premixing (Note 1) | | (1) | (2) | (3) | (4) | (4) | — | (5) | — | (6) | — | — |
| Kneader | Kind | Bi-axial | Mono-axial | Bi-axial | Mono-axial | Mono-axial | Mono-axial | Mono-axial | Bi-axial | Bi-axial | Bi-axial | Mono-axial |
| | Length of kneading section | 6D | 7D | 6D | 7D | 7D | 7D | 7D | 6D | 6D | 6D | 7D |
| | Pressure reduction (mmHg) | Yes 60 | Yes 60 | Yes 60 | Yes 60 | Yes 410 | No 760 | No 760 | No 760 | No 760 | Yes 60 | Yes 60 |
| Properties of materials | Particle size distribution (%) | | | | | | | | | | | |
| fed into kneader | 250 μm or more | 2 | 2 | 5 | 3 | 3 | 19 | 3 | 19 | 4 | 19 | 19 |
| | 150–250 μm | 10 | 13 | 9 | 14 | 14 | 18 | 10 | 18 | 12 | 18 | 18 |
| | Less than 150 μm | 88 | 85 | 86 | 83 | 83 | 63 | 87 | 63 | 84 | 63 | 63 |

TABLE 1-continued

|  |  | Examples | | | | | Comparative Examples | | | | | |
| --- | --- | --- | --- | --- | --- | --- | --- | --- | --- | --- | --- | --- |
|  |  | 1 | 2 | 3 | 4 | 5 | 1 | 2 | 3 | 4 | 5 | 6 |
|  | Acetone insoluble (%) | 0.1 | 0.1 | 0.2 | 0.1 | 0.1 | 3.1 | 0.2 | 3.1 | 0.1 | 3.1 | 3.1 |
|  | Dispersion degree (standard deviation) (Note 2) | 84 | 88 | 86 | 84 | 84 | 99 | 83 | 99 | 85 | 99 | 99 |
| Properties of epoxy resin composition after melt-kneading | Number of voids per package | 3 | 5 | 4 | 3 | 7 | 41 | 13 | 43 | 10 | 15 | 17 |
|  | Dispersion degree (standard deviation) | 36 | 37 | 36 | 35 | 34 | 40 | 34 | 40 | 35 | 39 | 41 |
|  | Spiral flow (cm) | 125 | 124 | 127 | 127 | 125 | 128 | 130 | 127 | 125 | 122 | 123 |
|  | Volatile content (%) | 0.07 | 0.07 | 0.08 | 0.07 | 0.09 | 0.12 | 0.11 | 0.13 | 0.12 | 0.08 | 0.07 |
|  | Granule density (g/cc) | 1.983 | 1.982 | 1.986 | 1.985 | 1.930 | 1.843 | 1.852 | 1.844 | 1.847 | 1.911 | 1.915 |

(Note 1) Grinder:
(1): Closed multi-stage shear extruder
(2): Continuous type rotary ball mill
(3): Batch type rotary bell mill
(4): Roller mill
(5): Corundum mill
(6): Vibration ball mill
(Note 2) Dispersion degree: Standard deviation of silica strength distribution was used as the dispersion degree of composition components.

As clear from the above Examples, in the present invention, since individual components are uniformly dispersed without proceeding of curing reaction in production of an epoxy resin composition for semiconductor encapsulation, the obtained epoxy resin composition shows sufficient fluidity when used in encapsulation of a chip for production of a semiconductor package; further, since melt-kneaded material is exposed to a reduced pressure, air trapped in the heating and kneading step and air bubbles formed in melting of a crystalline resin during kneading and molding can be removed from the resin component efficiently; thus, an epoxy resin composition for semiconductor encapsulation extremely low in voids generation and superior in moldability can be produced stably.

What is claimed is:

1. A process for producing an epoxy resin composition for semiconductor encapsulation, which comprises premixing raw materials containing at least an epoxy resin, a phenolic resin, a curing accelerator and an inorganic filler, then grinding the resulting premix using a grinder to obtain a ground material having such a particle size distribution that particles having particle diameters of 250 μm or more are 10% by weight or less, particles having particle diameters of 150 μm to less than 250 μm are 15% by weight or less and particles having particle diameters of less than 150 μm are 75% by weight or more, and melt-kneading the ground material under a reduced pressure.

2. A process for producing an epoxy resin composition for semiconductor encapsulation, which comprises premixing raw materials containing at least an epoxy resin, a phenolic resin, a curing accelerator and an inorganic filler, then grinding the resulting premix using a grinder to obtain a ground material having such a particle size distribution that particles having particle diameters of 250 μm or more are 10% by weight or less, particles having particle diameters of 150 μm to less than 250 μm are 15% by weight or less and particles having particle diameters of less than 150 μm are 75% by weight or more, melt-kneading the ground material, and exposing the resulting molten material to a reduced pressure.

3. A process for producing an epoxy resin composition for semiconductor encapsulation according to claim 1 or 2, wherein the reduced pressure is 460 mmHg or less when normal pressure is 760 mmHg.

4. A process for producing an epoxy resin composition for semiconductor encapsulation according to claim 1 or 2, wherein the melt-kneading is conducted by using a biaxial kneader or a monoaxial kneader.

5. A process for producing an epoxy resin composition for semiconductor encapsulation according to claim 1 or 2, wherein the ground material contains, in an acetone insoluble, particles having particle diameters of 212 μm or more, in an amount of 0.5% by weight or less.

6. An epoxy resin composition for semiconductor encapsulation, produced by the process, set forth in claim 1 or 2.

7. An epoxy resin composition for semiconductor encapsulation, produced by the process, set forth in claim 3.

8. An epoxy resin composition for semiconductor encapsulation, produced by the process, set forth in claim 4.

9. An epoxy resin composition for semiconductor encapsulation, produced by the process, set forth in claim 5.

10. A semiconductor device produced by using the epoxy resin composition for semiconductor encapsulation set forth in claim 6.

11. A semiconductor device produced by using the epoxy resin composition for semiconductor encapsulation set forth in claim 7.

12. A semiconductor device produced by using the epoxy resin composition for semiconductor encapsulation set forth in claim 8.

13. A semiconductor device produced by using the epoxy resin composition for semiconductor encapsulation set forth in claim 9.

14. A semiconductor device encapsulated by the composition of claim 6.

15. A semiconductor device encapsulated by the composition of claim 7.

16. A semiconductor device encapsulated by the composition of claim 8.

17. A semiconductor device encapsulated by the composition of claim 9.

* * * * *